(12) United States Patent
Lin et al.

(10) Patent No.: US 12,506,116 B2
(45) Date of Patent: Dec. 23, 2025

(54) SEMICONDUCTOR STRUCTURE AND METHOD OF FORMING THE SAME

(71) Applicant: Taiwan Semiconductor Manufacturing Company, Ltd., Hsinchu (TW)

(72) Inventors: Tseng Hsing Lin, Hsinchu (TW); Chien-Hsun Lee, Hsin-chu County (TW); Tsung-Ding Wang, Tainan (TW); Jung-Wei Cheng, Hsinchu (TW); Hao-Cheng Hou, Hsinchu (TW); Sheng-Chi Lin, Yilan County (TW); Jeng-An Wang, Hsinchu (TW); Yao-Cheng Wu, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 565 days.

(21) Appl. No.: 17/895,047

(22) Filed: Aug. 24, 2022

(65) Prior Publication Data
US 2024/0071999 A1 Feb. 29, 2024

(51) Int. Cl.
*H01L 25/065* (2023.01)
*H01L 21/66* (2006.01)
(Continued)

(52) U.S. Cl.
CPC .......... *H01L 25/0655* (2013.01); *H01L 22/34* (2013.01); *H01L 23/3114* (2013.01); *H01L 23/49827* (2013.01); *H01L 23/5381* (2013.01); *H01L 24/13* (2013.01); *H01L 24/25* (2013.01); *H01L 24/29* (2013.01); *H01L 24/73* (2013.01); *H01L 24/81* (2013.01); *H01L 24/82* (2013.01); *H01L 24/83* (2013.01); *H01L 24/91* (2013.01); *H01L 2224/13008* (2013.01); *H01L 2224/13024* (2013.01); *H01L 2224/25174* (2013.01);
(Continued)

(58) Field of Classification Search
CPC ............ H01L 25/0655; H01L 23/3114; H01L 23/49827
See application file for complete search history.

(56) References Cited

U.S. PATENT DOCUMENTS 8,993,380 B2    3/2015  Hou et al.
9,281,254 B2    3/2016  Yu et al.
(Continued)

*Primary Examiner* — Dale E Page
*Assistant Examiner* — Wilner Jean Baptiste
(74) *Attorney, Agent, or Firm* — JCIPRNET

(57) ABSTRACT

A first polymer layer is formed across a package region and a test region. A first metal pattern is formed in the package region and a first test pattern is simultaneously formed in the test region. The first metal pattern has an upper portion located on the first polymer layer and a lower portion penetrating through the first polymer layer, and the first test pattern is located on the first polymer layer and has a first opening exposing the first polymer layer. A second polymer layer is formed on the first metal pattern in the package region and a second test pattern is simultaneously formed on the first test pattern in the test region. The second polymer layer has a second opening exposing the upper portion of the first metal pattern, and the second test pattern has a third opening greater than the first opening of the first test pattern.

20 Claims, 11 Drawing Sheets

(51) Int. Cl.
  *H01L 23/00*  (2006.01)
  *H01L 23/31*  (2006.01)
  *H01L 23/498*  (2006.01)
  *H01L 23/538*  (2006.01)

(52) U.S. Cl.
  CPC .............. *H01L 2224/29024* (2013.01); *H01L 2224/73104* (2013.01); *H01L 2224/92124* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2012/0139015 A1* | 6/2012 | Yu ..................... H01L 21/76814 257/E21.409 |
| 2020/0075496 A1* | 3/2020 | Yu .......................... H01L 24/05 |

* cited by examiner

SEMICONDUCTOR STRUCTURE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Although the existing semiconductor structures or semiconductor packages have generally been adequate for their intended purposes, they have not been entirely satisfactory in all respects.

DETAILED DESCRIPTION

Figure 1:
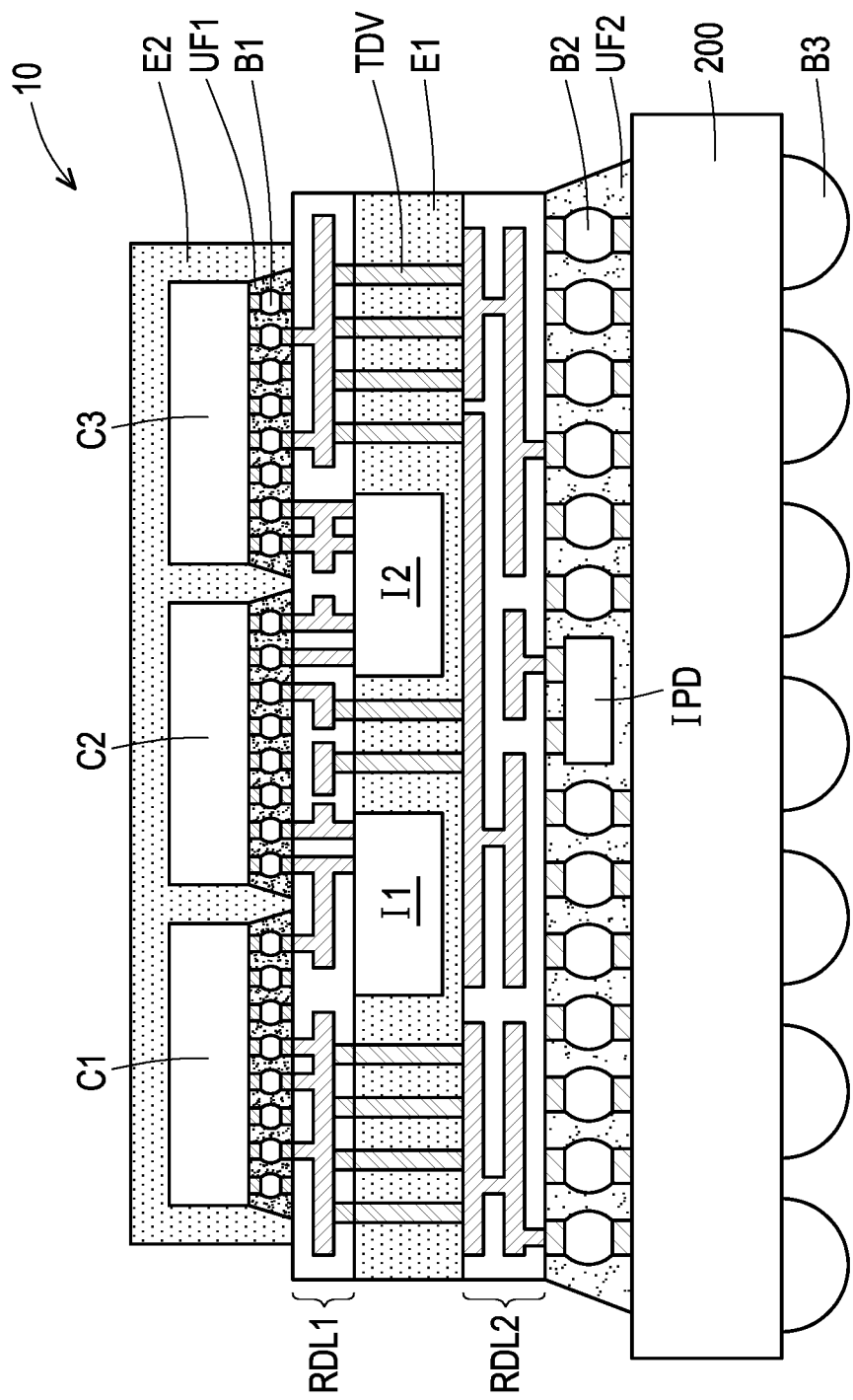
FIG. 1 illustrates a cross-sectional view of a semiconductor structure in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
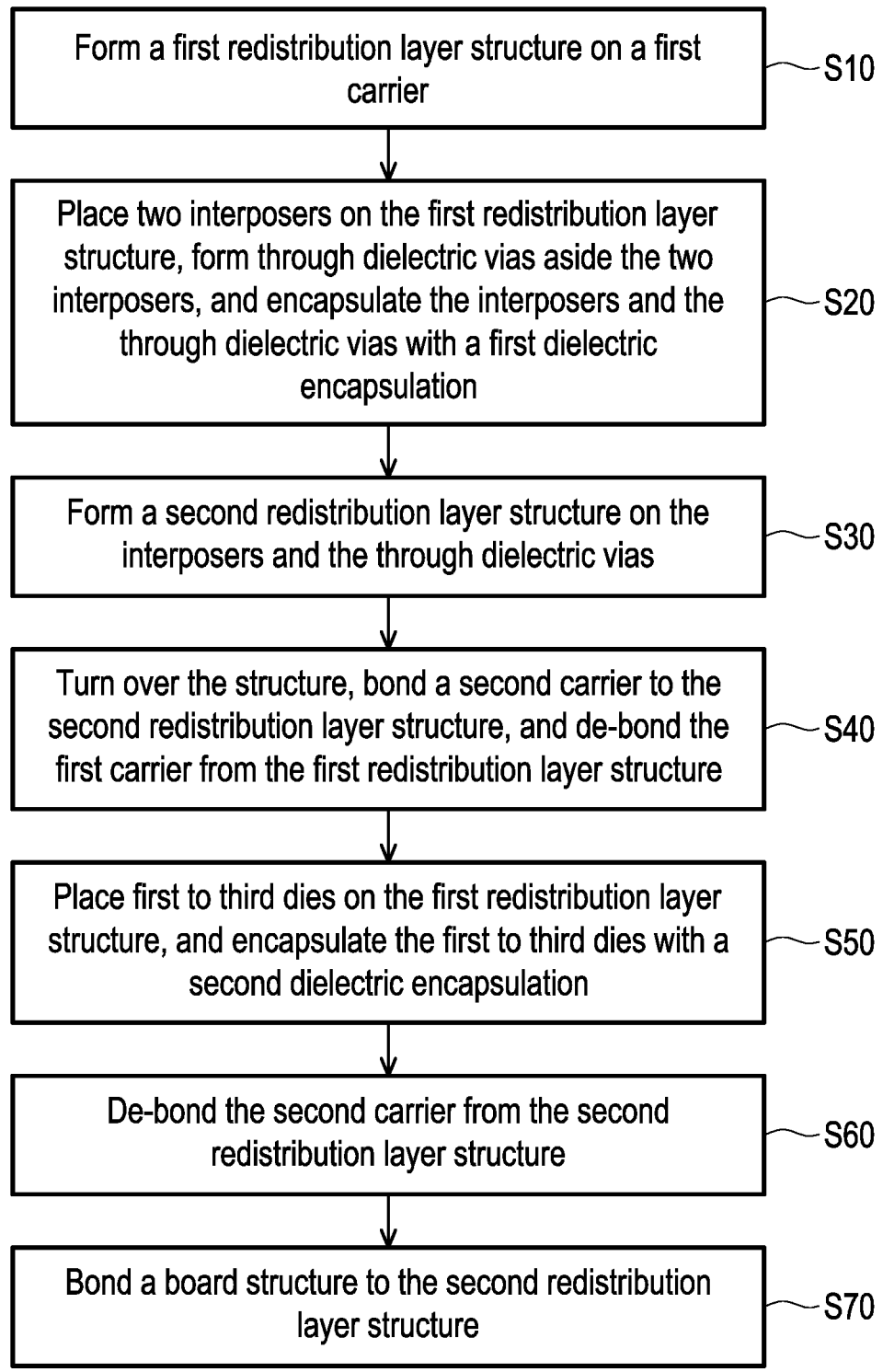
FIG. 2 illustrates a flow chart of a method of forming a semiconductor structure in accordance with some embodiments.

FIG. 1 illustrates a cross-sectional view of a semiconductor structure in accordance with some embodiments. FIG. 2 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Referring to FIG. 1 and FIG. 2, act S10 is implemented, in which a first redistribution layer structure RDL1 is formed on a first carrier (not shown). The first carrier may include a non-semiconductor material (such as a glass carrier, a ceramic carrier, or an organic material carrier), a semiconductor material (e.g., a silicon carrier), a conductive material (e.g., a metal-containing carrier) or the like. The first redistribution layer structure RDL1 may include metal features embedded by polymer layers. The metal features are disposed in the polymer layers and electrically connected with each other. The polymer layers may include a photo-sensitive material such as polybenzoxazole (PBO), polyimide (PT), benzocyclobutene (BCB), the like, or a combination thereof. The polymer layers of the first redistribution layer structure RDL1 may be replaced by dielectric layers or insulating layers as needed. The metal features include metal lines, metal vias and/or metal pads. The metal vias are formed between and in contact with two metal lines. The metal features may include Cu, Al, Ti, Ta, W, Ru, Co, Ni, the like, or a combination thereof. In some embodiments, a metal liner layer may be disposed between each metal feature and the polymer layer. In some embodiments, the metal liner layer includes a seed layer and/or a barrier layer. The seed layer may include Ti/Cu. The barrier layer may include Ta, TaN, Ti, TiN, CoW or a combination thereof. In some embodiments, the first redistribution layer structure RDL1 is formed by a dual damascene process. For example, a metal line and the underlying metal via may be formed as an integrated line and via structure without an interface by a dual damascene process.

Referring to FIG. 1 and FIG. 2, act S20 is implemented, in which two interposers I1 and I2 are placed on the first redistribution layer structure RDL1, through dielectric vias TDV are formed aside the two interposers, and a first dielectric encapsulation E1 is formed to encapsulate the interposers I1 and I2 and the through dielectric vias TDV.

Each of the interposers I1 and I2 may include a substrate, through substrate vias and conductive wirings on at least one of front side and back side of the substrate. In some embodiments, each of the interposers I1 and I2 is an active interposer that contains at least one functional device or integrated circuit device included between the substrate and the conductive wirings. In some embodiments, the functional device includes an active device, a passive device, or a combination thereof. The functional device includes, for example but not limited to, transistors, capacitors, resistors, diodes, photodiodes, fuse devices and/or other similar components. In other embodiments, each of the interposers I1 and I2 is a passive interposer, which is used to provide an electrical path but lack of a functional device or integrated circuit device. In some embodiments, the interposers I1 and I2 are bonded to the first redistribution layer structure RDL1 through micro-bumps, and an underfill layer is formed to fill the space between the first redistribution layer structure RDL1 and each of the interposers I1 and I2.

The through dielectric vias TDV may include a metal material such as Cu, Al, Ti, Ta, W, Ru, Co, Ni, the like, or a combination thereof. In some embodiments, a metal liner layer may be disposed between each metal material and the first dielectric encapsulation E1. In some embodiments, the metal liner layer includes a seed layer. The seed layer may include Ti/Cu. The through dielectric vias TDV may be formed by photolithography, plating, and photoresist stripping processes.

In some embodiments, the first dielectric encapsulation E1 includes a molding compound, a molding underfill, a resin or the like. In some embodiments, the first dielectric encapsulation E1 includes a polymer material such as polybenzoxazole (PBO), polyimide, benzocyclobutene (BCB), the like, or a combination thereof. The first dielectric encapsulation E1 may be formed by a molding process followed by a curing process.

Referring to FIG. 1 and FIG. 2, act S30 is implemented, in which a second redistribution layer structure RDL2 is formed on the interposers I1 and I2 and the through dielectric vias TDV. The second redistribution layer structure RDL2 may include metal features embedded by polymer layers. The metal features are disposed in the polymer layers and electrically connected with each other. The polymer layers may include a photo-sensitive material such as polybenzoxazole (PBO), polyimide (PI), benzocyclobutene (BCB), the like, or a combination thereof. The polymer layers of the second redistribution layer structure RDL2 may be replaced by dielectric layers or insulating layers as needed. The metal features include metal lines, metal vias and/or metal pads. The metal vias are formed between and in contact with two metal lines. The metal features may include Cu, Al, Ti, Ta, W, Ru, Co, Ni, the like, or a combination thereof. In some embodiments, a metal liner layer may be disposed between each metal feature and the polymer layer. In some embodiments, the metal liner layer includes a seed layer and/or a barrier layer. The seed layer may include Ti/Cu. The barrier layer may include Ta, TaN, Ti, TiN, CoW or a combination thereof. In some embodiments, the second redistribution layer structure RDL2 is formed by a dual damascene process. For example, a metal line and the underlying metal via may be formed as an integrated line and via structure without an interface by a dual damascene process.

In some embodiments, the critical dimension of the second redistribution layer structure RDL2 is different from (e.g., greater than) the critical dimension of the first redistribution layer structure RDL1. Specifically, the widths of the metal lines, metal vias, metal pads or metal connectors of the second redistribution layer structure RDL2 are different from (e.g., greater than) the widths of the metal lines, metal vias, metal pads or metal connectors of the first redistribution layer structure RDL1.

In some embodiments, the thicknesses of polymer layers and metal features of the second redistribution layer structure RDL2 are different from (e.g., greater than) the thicknesses of polymer layers and metal features of the first redistribution layer structure RDL1. In some embodiments, the thick polymer (about 1-200 um, such as 5-50 um or 100-150 um) and the underlying metal reflection may cause undesired light diffraction/interference during the inline overlay inspection, so the overlay measurement error may occur. The present disclosure provides a novel test key with better recognition for inline overlay inspection, so as to improve overlay control and therefore the device performance. The novel test key will be described in details below. In some embodiments, such novel test key is applied to the second redistribution layer structure RDL2 with greater polymer/metal thickness and/or critical dimension. However, the disclosure is not limited thereto. In other embodiments, such novel test key can be applied to the first redistribution layer structure RDL1.

The thick polymer is thick enough to provide a planar topography for the following operations. The thickness range of the thick polymer depends on whether an additional device is embedded in the thick layer. For example, when the thick polymer is configured to provide a planar topography, the thickness range is from about 1 um to 50 um. For example, when the (topmost) thick polymer is configured to embed an additional device, the thickness range is from about 50 um to 200 um. Other thickness range may be applicable.

Referring to FIG. 1 and FIG. 2, act S40 is implemented, in which the structure is turned over, a second carrier (not shown) is bonded to the second redistribution layer structure RDL2, and the first carrier is de-bonded from the first redistribution layer structure RDL1. The second carrier may include a non-semiconductor material (such as a glass carrier, a ceramic carrier, or an organic material carrier), a semiconductor material (e.g., a silicon carrier), a conductive material (e.g., a metal-containing carrier) or the like.

Referring to FIG. 1 and FIG. 2, act S50 is implemented, in which first to third dies C1 to C3 are placed on the first redistribution layer structure RDL1, and a second dielectric encapsulation E2 is formed to encapsulate the first to third dies C1 to C3. In some embodiments, the top surface of the second dielectric encapsulation E2 is higher than the top surfaces of the first to third dies C1. In other embodiments, the top surface of the second dielectric encapsulation E2 is flushed with the top surfaces of the first to third dies C1.

Each of the first to third dies C1 to C3 may include a logic die, a memory die, a CPU, a GPU, an xPU, a MEMS die, a SoC die, or the like. In some embodiments, the second die C2 may be a SoC die, and each of the first die C1 and the third die C3 may include a memory die or a memory stack such as High Bandwidth Memory (HBM) cube. The memory chips in the memory stack may have the same or different heights. The number of semiconductor dies is not limited to the disclosure.

In some embodiments, the first to third dies C1 to C3 are bonded to the first redistribution layer structure RDL1 through bumps B1. In some embodiments, the bumps B1 include solder bumps, and/or may include metal pillars (e.g., copper pillars), solder caps formed on metal pillars, and/or the like. The bumps B1 are referred to as "micro bumps" in some examples. The bumps B1 may be formed by a suitable process such as evaporation, electroplating, ball drop, or screen printing.

After the first to third dies C1 to C3 are bonded to the first redistribution layer structure RDL1, an underfill layer UF1 is formed to fill the space between the first redistribution layer structure RDL1 and each of the first to third dies C1 to C3, and surrounds the bumps B1. In some embodiments, the underfill layer UF1 includes a molding compound such as epoxy, and is formed using dispensing, injecting, and/or spraying process.

Thereafter, a second dielectric encapsulation E2 is formed around the first to third dies C1 to C3. Specifically, the second dielectric encapsulation E2 fills the gaps between the neighboring dies, and covers the sidewalls and tops of the first die C1, the second die C2 and the third die C3. In some embodiments, the second dielectric encapsulation E2 includes a molding compound, a molding underfill, a resin or the like. In some embodiments, the second dielectric encapsulation E2 includes a polymer material such as polybenzoxazole (PBO), polyimide, benzocyclobutene (BCB), the like, or a combination thereof. The second dielectric encapsulation E2 may be formed by a molding process followed by a curing process.

Referring to FIG. 1 and FIG. 2, act S60 is implemented, in which the second carrier is de-bonded from the second redistribution layer structure RDL2. In some embodiments, the structure is turned over, a third carrier (not shown) is bonded to the first to third dies C1 to C3, and the second carrier is de-bonded from the first second redistribution layer structure RDL2.

Referring to FIG. 1 and FIG. 2, act S70 is implemented, in which a board structure 200 is bonded to the second redistribution layer structure RDL2. The third carrier is then de-bonded from the first to third dies C1 to C3.

In some embodiments, the board substrate 200 includes a core layer and two build-up layers on opposite sides of the core layer. In some embodiments, the core layer includes prepreg (which contains epoxy, resin, and/or glass fiber), polyimide, photo image dielectric (PID), the like, or a combination thereof. In some embodiments, the build-up layers include prepreg (which contains epoxy, resin, and/or glass fiber), polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), the like, or a combination thereof. The material of the core layer may be different from the material of the build-up layers. In some embodiments, the board substrate 200 includes wiring patterns that penetrate through the core layer and the build-up layers for providing electrical routing between different interposers, dies or die stacks. The wiring patterns include lines, vias, pads and/or connectors. The board substrate 200 is referred to as a "printed circuit board (PCB)" in some examples. In other embodiments, the core layer of the board substrate 200 may be omitted as needed, and such board substrate 200 is referred to as a "coreless board substrate".

In some embodiments, the board substrate 200 is bonded to the second redistribution layer structure RDL2 through the bumps B2. In some embodiments, the bumps B2 include solder bumps, and/or may include metal pillars (e.g., copper pillars), solder caps formed on metal pillars, and/or the like. The bumps B2 are referred to as "controlled collapse chip connection (C4) bumps" in some examples. The bumps B2 may be formed by a suitable process such as evaporation, electroplating, ball drop, or screen printing.

In some embodiments, at least one integrated passive device IPD is provided and interposed between the second redistribution layer structure RDL2 and the board substrate 200. The integrated passive device IPD is referred to as an embedded passive component (EPC) in some examples. In some embodiments, the integrated passive device IPD includes a resistor, a capacitor, an inductor, the like or a combination thereof. In some embodiments, the integrated passive device IPD are bonded to the second redistribution layer structure RDL2 through micro-bumps, and an underfill layer is formed to fill the space between the second redistribution layer structure RDL2 and integrated passive device IPD.

After the board substrate 200 is bonded to the second redistribution layer structure RDL2, an underfill layer UF2 is formed to fill the space between the second redistribution layer structure RDL2 and the board substrate 200, and surrounds the integrated passive device IPD and the bumps B2. In some embodiments, the second underfill layer UF2 includes a molding compound such as epoxy, and is formed using dispensing, injecting, and/or spraying process.

Afterwards, bumps B3 are formed below and electrically connected to the board substrate 200. In some embodiments, the bumps B3 include solder bumps, and/or may include metal pillars (e.g., copper pillars), solder caps formed on metal pillars, and/or the like. The bumps B3 are referred to as "ball grid array (BGA) balls" in some examples. The bumps B3 may be formed by a suitable process such as evaporation, electroplating, ball drop, or screen printing. In some embodiments, the semiconductor package 10 of the disclosure is thus completed.

Figure 3A:
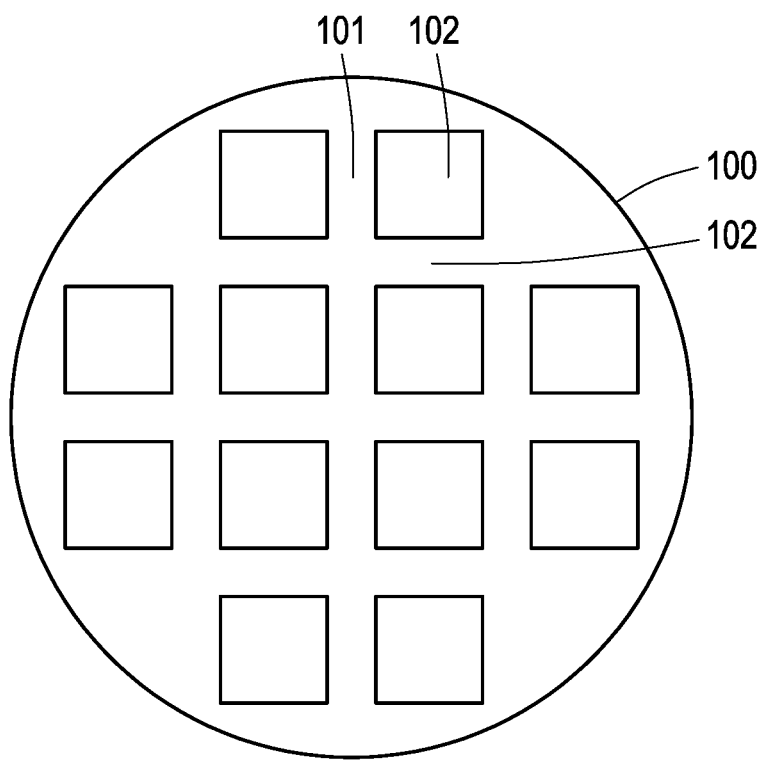
FIG. 3A illustrates a simplified top view of a carrier with multiple package regions in accordance with some embodiments.
Figure 3B:
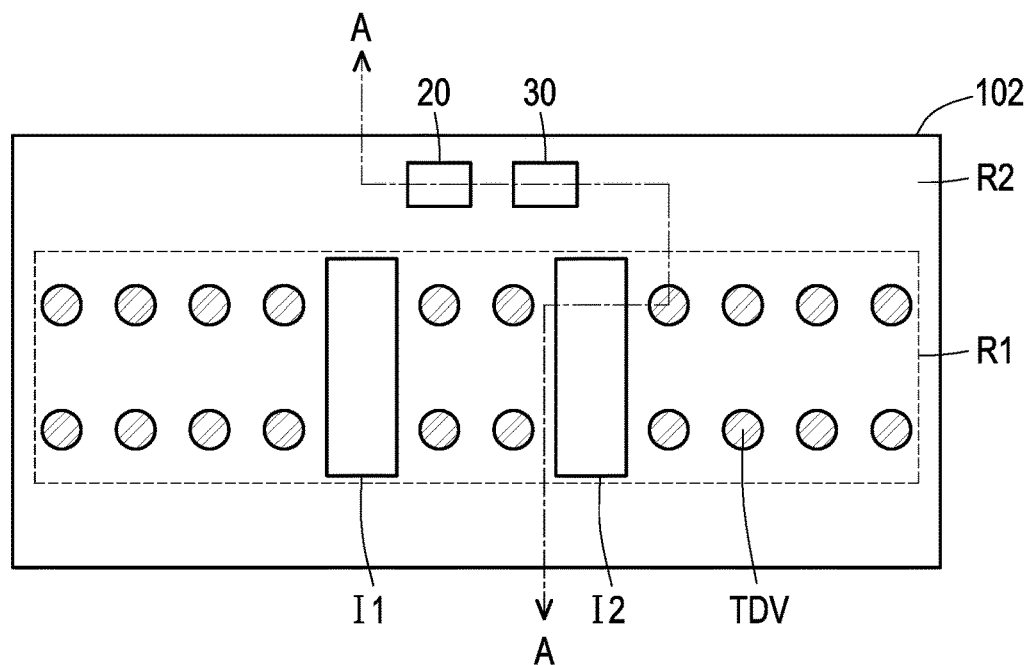
FIG. 3B illustrates an enlarged view of a package region in FIG. 3A in accordance with some embodiments.
Figure 3C:
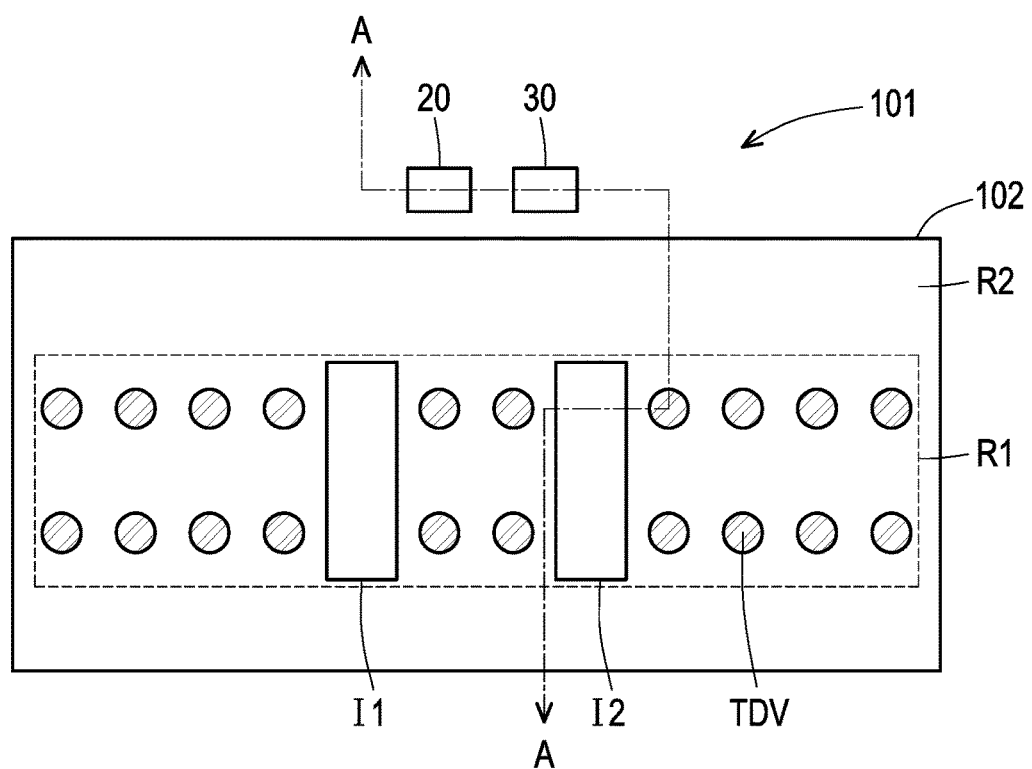
FIG. 3C illustrates an enlarged view of a package region in FIG. 3A in accordance with other embodiments.

FIG. 3A illustrates a simplified top view of a carrier with multiple package regions in accordance with some embodiments. FIG. 3B illustrates an enlarged view of a package region in FIG. 3A in accordance with some embodiments. FIG. 3C illustrates an enlarged view of a package region in FIG. 3A in accordance with other embodiments.

In some embodiments, a carrier 100 or wafer is provided with a plurality of package regions 102. In some embodiment, the carrier 100 may include a non-semiconductor material (such as a glass carrier, a ceramic carrier, or an organic material carrier), a semiconductor material (e.g., a silicon carrier), a conductive material (e.g., a metal-containing carrier) or the like. The package regions 102 are separated or defined by scribe lines or scribe regions 101. The scribe regions 101 are cut therethrough in a later fabrication process to provide individual integrated circuit packages. In some embodiments, the carrier 100 is the first carrier in act S10 of FIG. 2.

In some embodiments, in each package region 102, interposers I1 and I2 and through dielectric vias TDV are provided and encapsulated by a first dielectric encapsulation E1. The package region 102 may have a component region R1 and a periphery region R2 aside the component region R1. In some embodiments, the periphery region R2 surrounds the component region R1. In some embodiments, the component region R1 is a region including electrical components, such as the interposers I1 and I2 and/or the through dielectric vias TDV, and the periphery region R1 is a region free of any electrical component. In some embodiments, the component region R1 is a pattern-dense region, and the periphery region R2 is a pattern-sparse region.

In some embodiments, first and second test regions 20 and 30 are further provided and configured to accommodate test key structures (e.g., overlay marks) for in-line inspection. In some embodiments, as shown in FIG. 3B, the first and second test regions 20 and 30 are included in the periphery region R2 of the package region 102, and will eventually remain in the final product after scribing and separating the package regions 102 along the scribe regions 101. However, the disclosure is not limited thereto. In other embodiments, as shown in FIG. 3C, the first and second test regions 20 and 30 are included in the scribe region 101, and will be removed from the final product after scribing and separating the package regions 102 along the scribe regions 101.

FIG. 4A to FIG. 4E illustrate different views of a method of forming a semiconductor structure taken along line A-A of FIG. 3B or FIG. 3C in accordance with some embodiments.

Figure 4A:
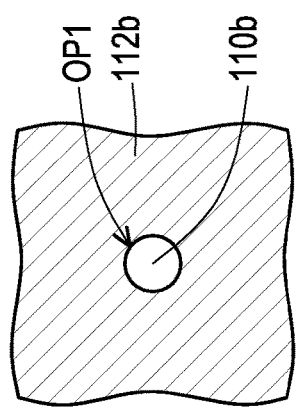
FIG. 4A to FIG. 4E illustrate different views of a method of forming a semiconductor structure taken along line A-A of FIG. 3B or FIG. 3C in accordance with some embodiments.
Figure 4A:
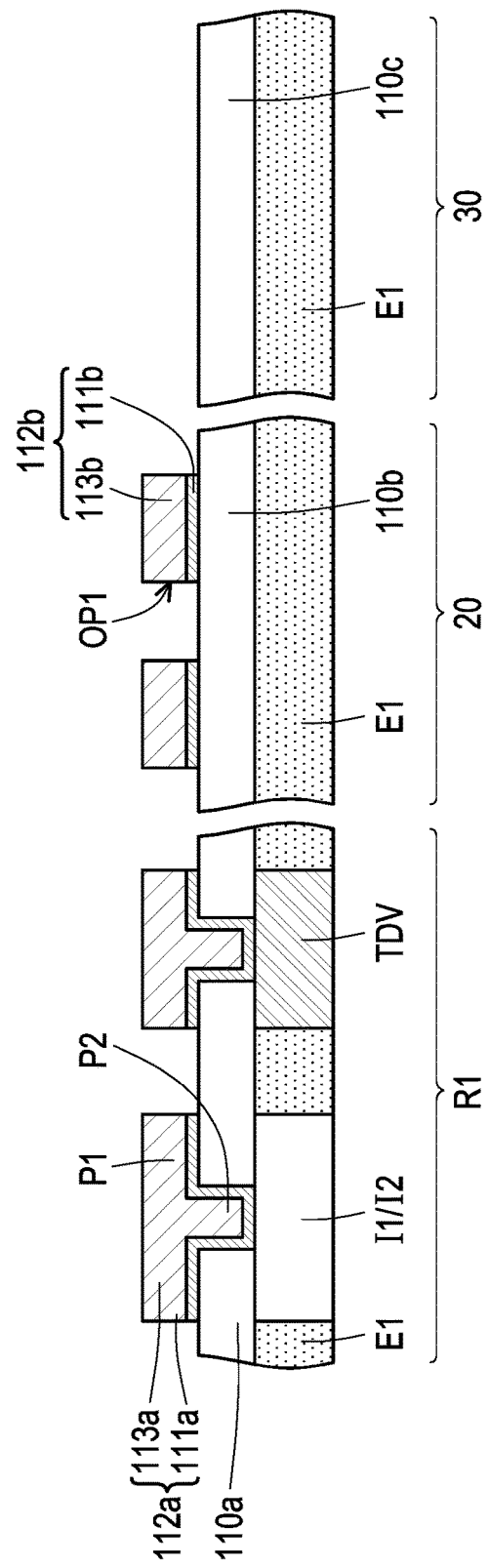

Referring to FIG. 4A, a carrier is provided with a component region R1, a first test region 20 and a second test region 30. In some embodiments, interposers I1 and I2 are provided in the component region R1, and multiple through dielectric vias TDV are formed around the interposers I1 and I2. Thereafter, a first dielectric encapsulation E1 is formed around the interposers I1 and I2 and the through dielectric vias TDV in the component region R1. The first dielectric encapsulation E1 is further formed across the first and second test regions 20 and 30.

Thereafter, a first polymer layer is formed over the first dielectric encapsulation E1 across the component region R1, the first test region 20 and the second test region 30. Specifically, a first polymer layer 110a is formed in the first component region R1, a first polymer layer 110b is formed in the first test region 20, and a first polymer layer 110c is formed in the second region. The first polymer layers 110a, 110b and 110c are collectively referred to as a first polymer layer. The first polymer layers 110a, 110b and 110c are positioned at substantially the same level, and are formed simultaneously in the same process operation. The first polymer layer may include PBO, polyimide, BCB, the like, or a combination thereof, and may be formed by a suitable fabrication technique such as spin-coating, lamination, deposition or the like.

Afterwards, a first metal pattern 112a is formed in the component region R1 and a first test pattern 112b is simultaneously formed in the first test region 20. The first metal pattern 112a has an upper portion P1 located on the first polymer layer 110a and a lower portion P2 penetrating through the first polymer layer 110a and electrically connected to the underlying interposer I1/I2 and the through dielectric vias TDV. The first test pattern 112b is located on the first polymer layer 110b and has an opening OP1 exposing a portion of the first polymer layer 110b.

The method of forming the first metal pattern 112a and the first test pattern 112b includes the following operations. The first polymer layer 110a is patterned to form openings that expose the underlying interposer I1/I2 and the through dielectric vias TDV. The patterning process includes photolithography and etching processes. Thereafter, a seed material layer is formed across the component region R1, the first test region 20 and the second test region 30, covers the top of the first polymer layer 110a and the surfaces of the openings in the component region R1, and covers the tops of the first polymer layers 110b and 110c in the first and second test regions 20 and 30. In some embodiments, the seed material layer includes a titanium/copper composite layer, and is formed by a sputtering process. Thereafter, a photoresist layer (not shown) with openings is formed on the seed material layer, and the openings of the photoresist layer expose the intended location for the subsequently formed upper portion P1 of the first pattern 112a in the component region R1 and expose the intended location for the subsequently formed first test pattern 112b in the first test region 20. The photoresist layer covers the first polymer layer 110c in the second test region 30. Afterwards, an electroplating process is performed to form a metal material layer (e.g., a copper layer) on the seed material layer exposed by the openings of the photoresist layer. The photoresist layer and the underlying seed material layer are removed, so as to form the first metal pattern 112a in the component region R1 and the first test pattern 112b in the first test region 20. In some embodiments, the first metal pattern 112a includes a seed layer 111a and a metal layer 113a. The first test pattern 112b includes a seed layer 111b and a metal layer 113b. In some embodiments, from a top view, the first test pattern 112b is a metal bulk with an opening OP1 exposing the underlying first polymer layer 110b.

Figure 4B:
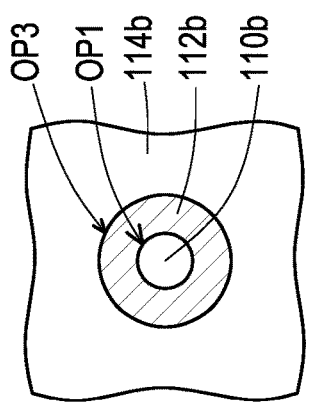
Figure 4B:
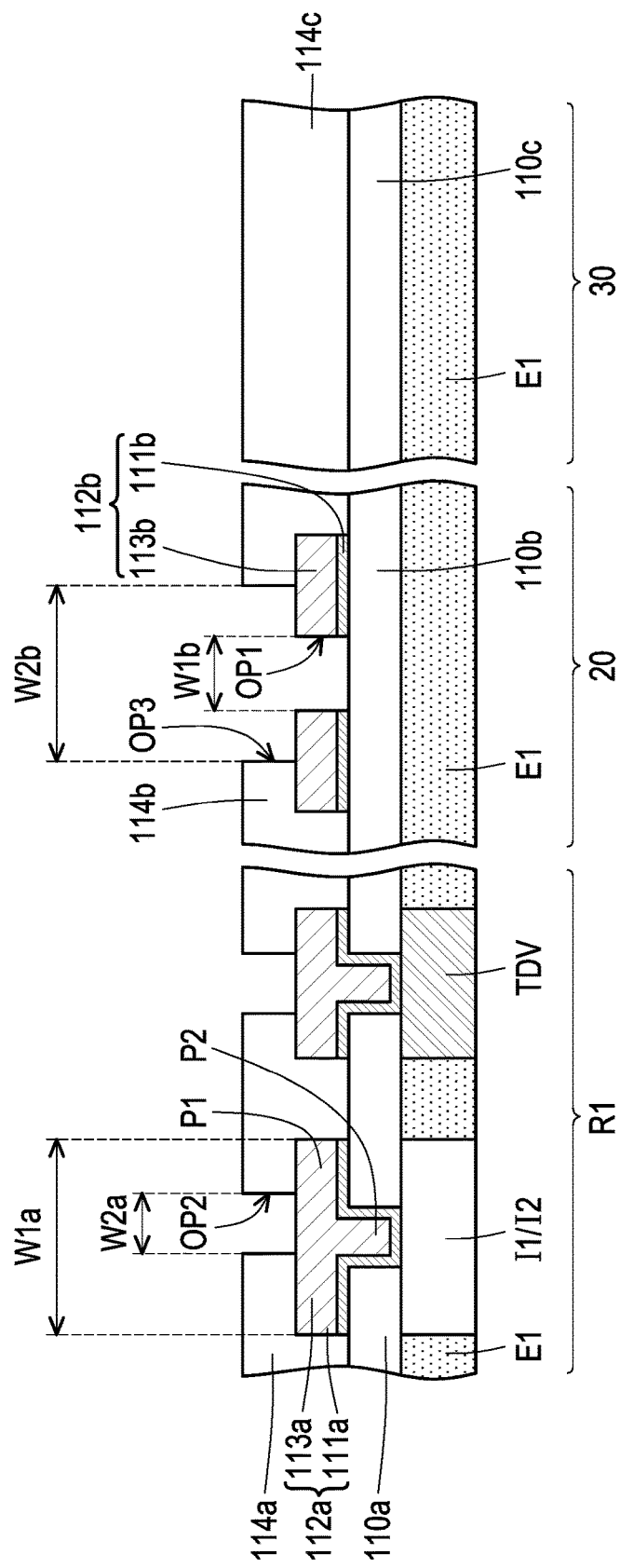

Referring to FIG. 4B, a second polymer layer 114a is formed on the first metal pattern 112a in the component region R1, and a second test pattern 114b is simultaneously formed on the first test pattern 112b in the first test region 20. The second polymer layer 114a has an opening OP2 exposing a portion of the upper portion P1 of the first metal pattern 112a. The second test pattern 114b has an opening OP3 greater than the opening OP1 of the first test pattern 112b. In some embodiments, a second polymer layer 114c is blanketly formed on the first polymer layer 112c in the second test region 30.

The method of forming the second polymer layer 114a and the second test pattern 114b includes the following operations. In some embodiments, a polymer material layer (not shown) is formed across the component region R1, the first test region 20 and the second test region 30. The polymer material layer may include PBO, polyimide, BCB, the like, or a combination thereof, and may be formed by a suitable fabrication technique such as spin-coating, lamination, deposition or the like. The polymer material layer is patterned to form a second polymer layer 114a having an opening OP2 that exposes a portion of the first metal pattern 112a in the component region R1, and simultaneously form a second test pattern 114b having an opening OP3 that exposes a portion of the first test pattern 112b, and simultaneously form a second polymer layer 114c without openings in the second test region 30. The patterning process includes photolithography and etching processes. Specifically, the second test region 30 is not subjected to the patterning process.

In the conventional process, the shapes of the test patterns are usually similar to the shapes of the product patterns. However, the shapes of the product patterns cause undesired diffraction/interference due to pattern overlapping.

Specifically, the product patterns such as the first metal pattern 112a and the second polymer layer 114a may cause undesired diffraction/interference due to pattern overlapping if they serve as conventional test patterns. As shown in FIG. 4B, in the component region R1, the width W2a of the opening OP2 of the second polymer layer 114a is less than the width W1a of the upper portion P1 of the first metal pattern 112a, and the sidewall of the upper portion P1 of the first metal pattern 112a is covered by the second polymer layer 114a. By such configuration, both the width W1a and the width W2a cannot be accurately measured during the optical overlay inspection, because thick polymer layer 114a covers the sidewall of the upper portion P1 of the first metal pattern 112a and causes undesired light diffraction/interference during the overlay measurement process. Therefore, the present disclosure provides a novel test key to avoid the issue.

In some embodiments, in the first test region 20, the first test pattern 112b and the second test pattern 114b constitute an overlay mark for checking alignment accuracy between layers. In some embodiments, from a top view, the second test pattern 114b is a dielectric bulk with an opening OP3 exposing the underlying first test pattern 112b and the first polymer layer 110b. Specifically, the width W2b of the opening OP3 of the second test pattern 114b is greater than the width W1b of the opening OP1 of the first test pattern 112b. In some embodiments, both the opening OP3 and the opening OP1 have substantially straight sidewalls. However, the disclosure is not limited thereto. In other embodiments, both the opening OP3 and the opening OP1 have inclined sidewalls. The overlay mark in the first test region 20 including the first test pattern 112b and the second test pattern 114b is configured to measure the overlay data or overlay offset between the second polymer layer 114a and the underlying first metal pattern 112a. In the disclosure, since the opening OP3 is greater than the opening OP1, so the sidewall of the opening OP3 of the second test pattern 114b and the sidewall of the opening OP1 of the second test pattern 114b are both exposed to the optical measurement tool during the overlay inspection; and thus, the undesired light diffraction/interference due to pattern overlapping is not observed in the disclosure. The overlay mark of the disclosure exhibits better pattern recognition for inline inspection, so as to provide better overlay control and therefore improve the device performance.

Figure 4C:
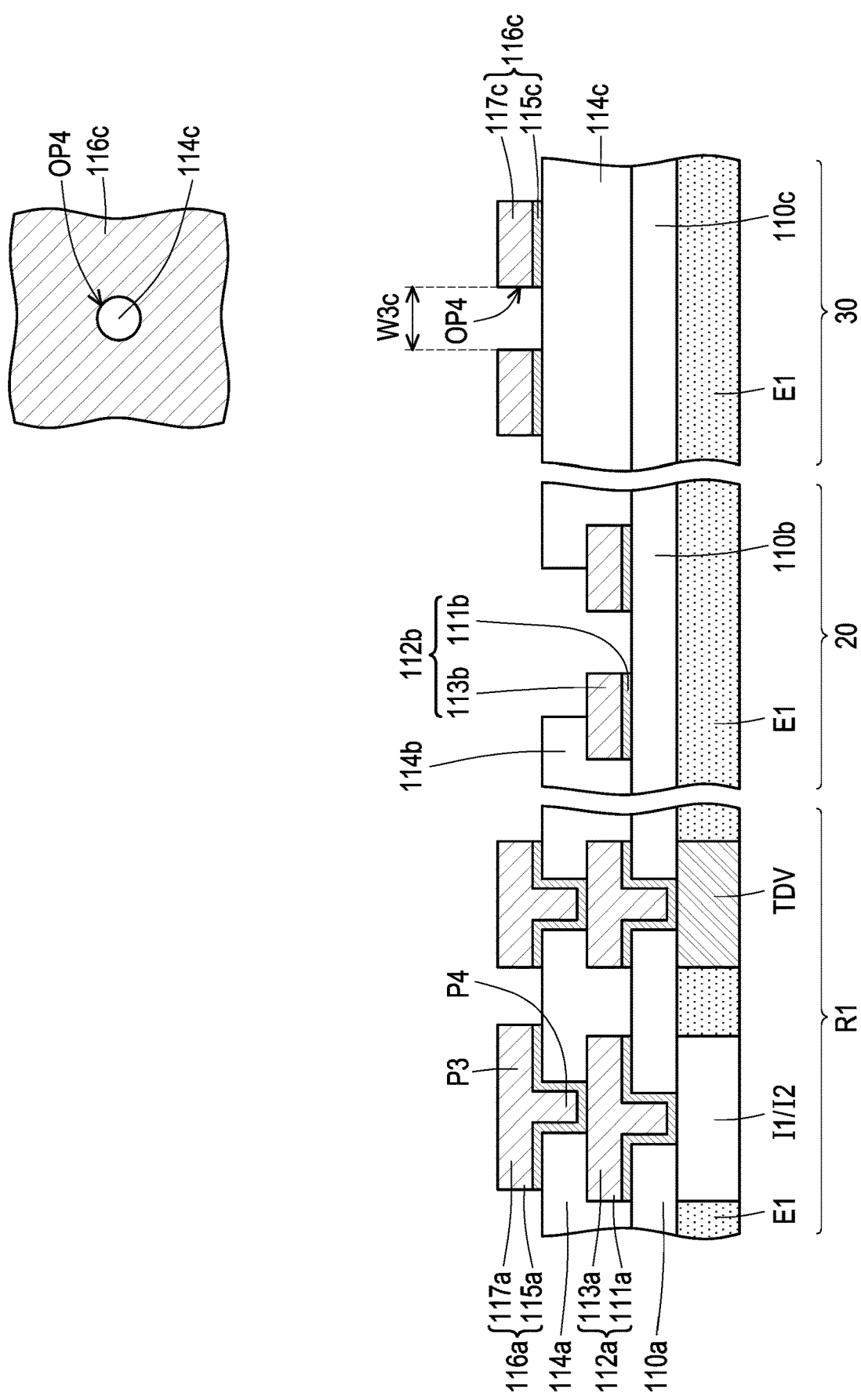

Referring to FIG. 4C, a second metal pattern 116a is formed in the component region R1 and a third test pattern 116c is simultaneously formed in the second test region 30. The second metal pattern 116a has an upper portion P3 located on the second polymer layer 114a and a lower portion P4 penetrating through the second polymer layer 114a and electrically connected to the first metal pattern 112a. The second test pattern 114c is located on the second polymer layer 114c and has an opening OP4 exposing a portion of the second polymer layer 114c.

The method of forming the second metal pattern 116a and the third test pattern 116c includes the following operations. A seed material layer is formed across the component region R1, the first test region 20 and the second test region 30, covers the top of the second polymer layer 114a and the surfaces of the openings OP2 in the component region R1, and covers the tops of the second polymer layers 114b and 114c in the first and second test regions 20 and 30. In some embodiments, the seed material layer includes a titanium/copper composite layer, and is formed by a sputtering process. Thereafter, a photoresist layer (not shown) with openings is formed on the seed material layer, and the openings of the photoresist layer expose the intended location for the subsequently formed upper portion P3 of the second metal pattern 116a in the component region R1 and expose the intended location for the subsequently formed third test pattern 116c in the second test region 30. The photoresist layer covers the second test pattern 114b and the first test pattern 112a in the first test region 20. Afterwards, an electroplating process is performed to form a metal material layer (e.g., a copper layer) on the seed material layer exposed by the openings of the photoresist layer. The photoresist layer and the underlying seed material layer are removed, so as to form the second metal pattern 116a in the component region R1 and the third test pattern 116c in the second test region 30. In some embodiments, the second metal pattern 116a includes a seed layer 115a and a metal layer 117a. The third test pattern 116c includes a seed layer 115c and a metal layer 117c. In some embodiments, from a top view, the third test pattern 116c is a metal bulk with an opening OP4 exposing the underlying second polymer layer 114c.

Figure 4D:
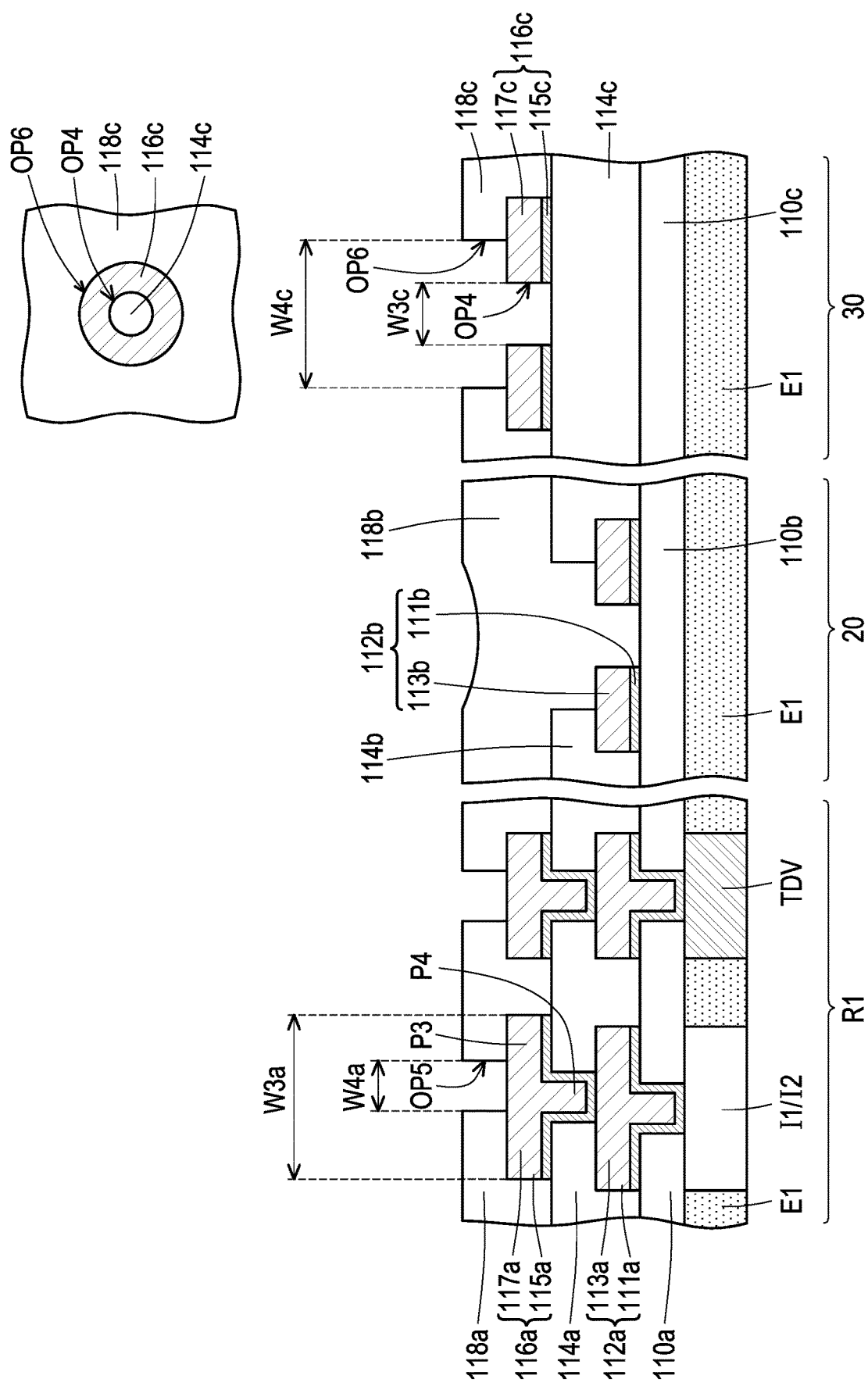

Referring to FIG. 4D, a third polymer layer 118a is formed on the second metal pattern 116a in the component region R1, and a fourth test pattern 118c is simultaneously formed on the third test pattern 116c in the second test region 30. The third polymer layer 118a has an opening OP5 exposing a portion of the upper portion P3 of the second metal pattern 116a. The fourth test pattern 118c has an opening OP6 greater than the opening OP4 of the third test pattern 116c. In some embodiments, a third polymer layer 118b is blanketly formed in the first test region 20, covering the second test pattern 114b and the first test pattern 112b.

The method of forming the third polymer layer 118a and the fourth test pattern 118c includes the following operations. In some embodiments, a polymer material layer (not shown) is formed across the component region R1, the first test region 20 and the second test region 30. The polymer material layer may include PBO, polyimide, BCB, the like, or a combination thereof, and may be formed by a suitable fabrication technique such as spin-coating, lamination, deposition or the like. The polymer material layer is patterned to form a third polymer layer 118a having an opening OP5 that exposes a portion of the second metal pattern 116a in the component region R1, and simultaneously form a fourth test pattern 116c having an opening OP6 that exposes a portion of the third test pattern 118c, and simultaneously form a third polymer layer 118b without openings in the first test region 20. The patterning process includes photolithography and etching processes. Specifically, the first test region 20 is not subjected to the patterning process.

In the conventional process, the shapes of the test patterns are usually similar to the shapes of the product patterns. However, the shapes of the product patterns cause undesired diffraction/interference due to pattern overlapping.

Specifically, the product patterns such as the second metal pattern 116a and the third polymer layer 118a may cause undesired diffraction/interference due to pattern overlapping if they serve as conventional test patterns. As shown in FIG. 4D, in the component region R1, the width W4a of the opening OP5 of the third polymer layer 118a is less than the width W3a of the upper portion P3 of the second metal pattern 116a, and the sidewall of the upper portion P3 of the second metal pattern 116a is covered by the third polymer layer 118a. By such configuration, both the width W3a and the width W4a cannot be accurately measured during the optical overlay inspection, because thick polymer layer 118a covers the sidewall of the upper portion P3 of the second metal pattern 116a and causes undesired light diffraction/interference during the overlay measurement process. Therefore, the present disclosure provides a novel test key to avoid the issue.

In some embodiments, in the second test region 30, the third test pattern 116c and the fourth test pattern 118c constitute an overlay mark for checking alignment accuracy between layers. In some embodiments, from a top view, the fourth test pattern 118c is a dielectric bulk with an opening OP6 exposing the underlying third test pattern 116c and the second polymer layer 114c. Specifically, the width W4c of the opening OP6 of the fourth test pattern 118c is greater than the width W3c of the opening OP4 of the third test pattern 116c. In some embodiments, both the opening OP6 and the opening OP4 have substantially straight sidewalls. However, the disclosure is not limited thereto. In other embodiments, both the opening OP6 and the opening OP4 have inclined sidewalls. The overlay mark in the second test region 30 including the third test pattern 116c and the fourth test pattern 118c is configured to measure the overlay data or overlay offset between the third polymer layer 118a and the underlying second metal pattern 116a. In the disclosure, since the opening OP6 is greater than the opening OP4, so the sidewall of the opening OP4 of the third test pattern 116c and the sidewall of the opening OP6 of the third test pattern 116c are both exposed to the optical measurement tool during the overlay inspection; and thus, the undesired light diffraction/interference due to pattern overlapping is not observed in the disclosure. The overlay mark of the disclosure exhibits better pattern recognition for inline inspection, so as to provide better overlay control and therefore improve the device performance.

Figure 4E:
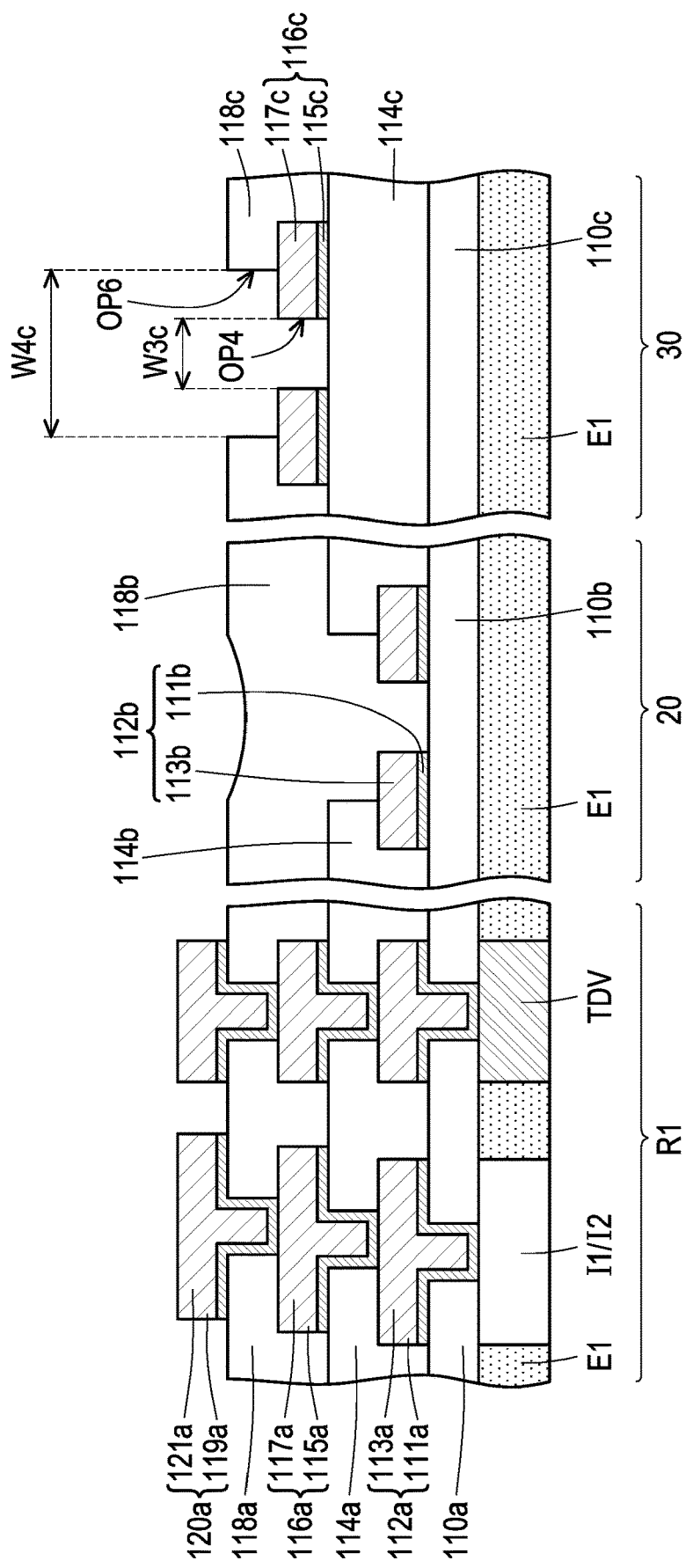

Referring to FIG. 4E, an operation similar to that described in FIG. 4C is performed, so as to form a third metal pattern 120a in the component region R1. The third metal pattern 120a may have an upper portion located on the third polymer layer 118a and a lower portion penetrating through the third polymer layer 118a and electrically connected to the second metal pattern 116a. In some embodiments, the third metal pattern 120a includes a seed layer 119a and a metal layer 121a. In some embodiments, the third metal pattern 120a is the topmost metal feature serving as an under bump metallization (UBM) pads for ball mount. However, the disclosure is not limited thereto. In some embodiments, the operations of FIG. 4C and FIG. 4D may be repeated as many times as necessary, until the number of metal layers/vias meets the process requirements. At least one test region can be further included in the package region or scribe region, so as to accommodate the novel test keys of the disclosure for inspecting overlay performance between higher level metal pattern(s) and the overlying polymer layer(s).

In some embodiments, a semiconductor structure includes a first polymer layer 110a/110b disposed across a package region R1 and a test region 20, a first metal pattern 112a is disposed in the package region R1 and has an upper portion P1 located on the first polymer layer 110a and a lower portion P2 penetrating through the first polymer layer 110a and electrically connected to an underlying electrical component; a first test pattern 112b disposed in the test region 20, wherein the first test pattern 112b is located on the first polymer layer 110b and has a first opening OP1 exposing a portion of the first polymer layer 110b; a second polymer layer 114a disposed on the first metal pattern 112a in the package region R1, wherein the second polymer layer 114a has a second opening OP2 exposing a portion of the upper portion P1 of the first metal pattern 112a; and a second test pattern 114b disposed on the first test pattern 112b in the test region 20, wherein the second test pattern 114b has a third opening OP3 greater than the first opening OP1 of the first test pattern 112b.

In some embodiments, the test region 20 is in a periphery region of the package region. In some embodiments, the test region 20 is in a scribe region or a seal ring region. In some embodiments, the electrical component includes an interposer, a through via, a semiconductor die, the like, or a combination thereof. In some embodiments, the first test pattern 112b and the second test pattern 114b constitute an overlay mark. In some embodiments, the third opening OP3 of the second test pattern 114b exposes a portion of the first test pattern 112b and the first polymer layer 110b.

Figure 5:
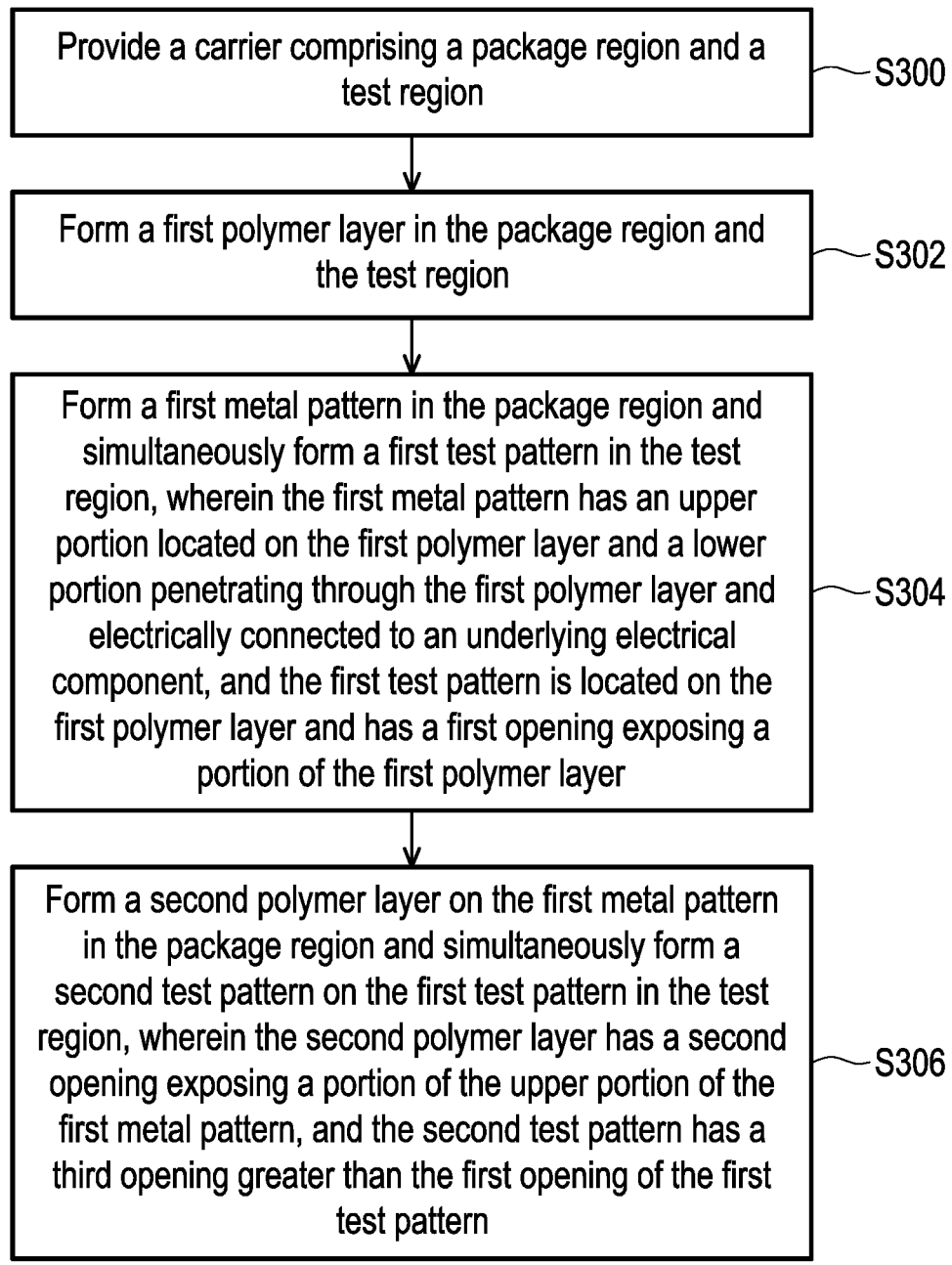
FIG. 5 illustrates a flow chart of a method of forming a semiconductor structure in accordance with some embodiments.

FIG. 5 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a carrier is provided with a package region and a test region. FIGS. 3A to 3C and FIG. 4A illustrate different views corresponding to some embodiments of act S300. In some embodiments, the test region is in a periphery region of the package region, as shown in FIG. 3A and FIG. 3B. In some embodiments, the carrier includes a plurality of package regions separated by a plurality of scribe regions, and the test region is in the scribe regions, as shown in FIG. 3A and FIG. 3C.

At act S302, a first polymer layer is formed in the package region and the test region. FIG. 4A illustrates a cross-sectional view corresponding to some embodiments of act S302.

At act S304, a first metal pattern is formed in the package region and a first test pattern is simultaneously formed in the test region, wherein the first metal pattern has an upper portion located on the first polymer layer and a lower portion penetrating through the first polymer layer and electrically connected to an underlying electrical component, and the first test pattern is located on the first polymer layer and has a first opening exposing a portion of the first polymer layer. FIG. 4A illustrates different views corresponding to some embodiments of act S304. In some embodiments, the first metal pattern and the first test pattern are formed by an electroplating process. In some embodiments, the electrical component is an interposer. In some embodiments, the electrical component includes metal lines/vias. In some embodiments, the electrical component includes a semiconductor die.

At act S306, a second polymer layer is formed on the first metal pattern in the package region and a second test pattern is simultaneously formed on the first test pattern in the test region, wherein the second polymer layer has a second opening exposing a portion of the upper portion of the first metal pattern, and the second test pattern has a third opening greater than the first opening of the first test pattern. FIG. 4B illustrates different views corresponding to some embodiments of act S306. In some embodiments, the first test pattern and the second test pattern constitute an overlay mark. In some embodiments, the third opening of the second test pattern exposes a portion of the first test pattern and the first polymer layer. In some embodiments, a width of the second opening of the second polymer layer is less than a width of the upper portion of the first metal pattern.

Figure 6:
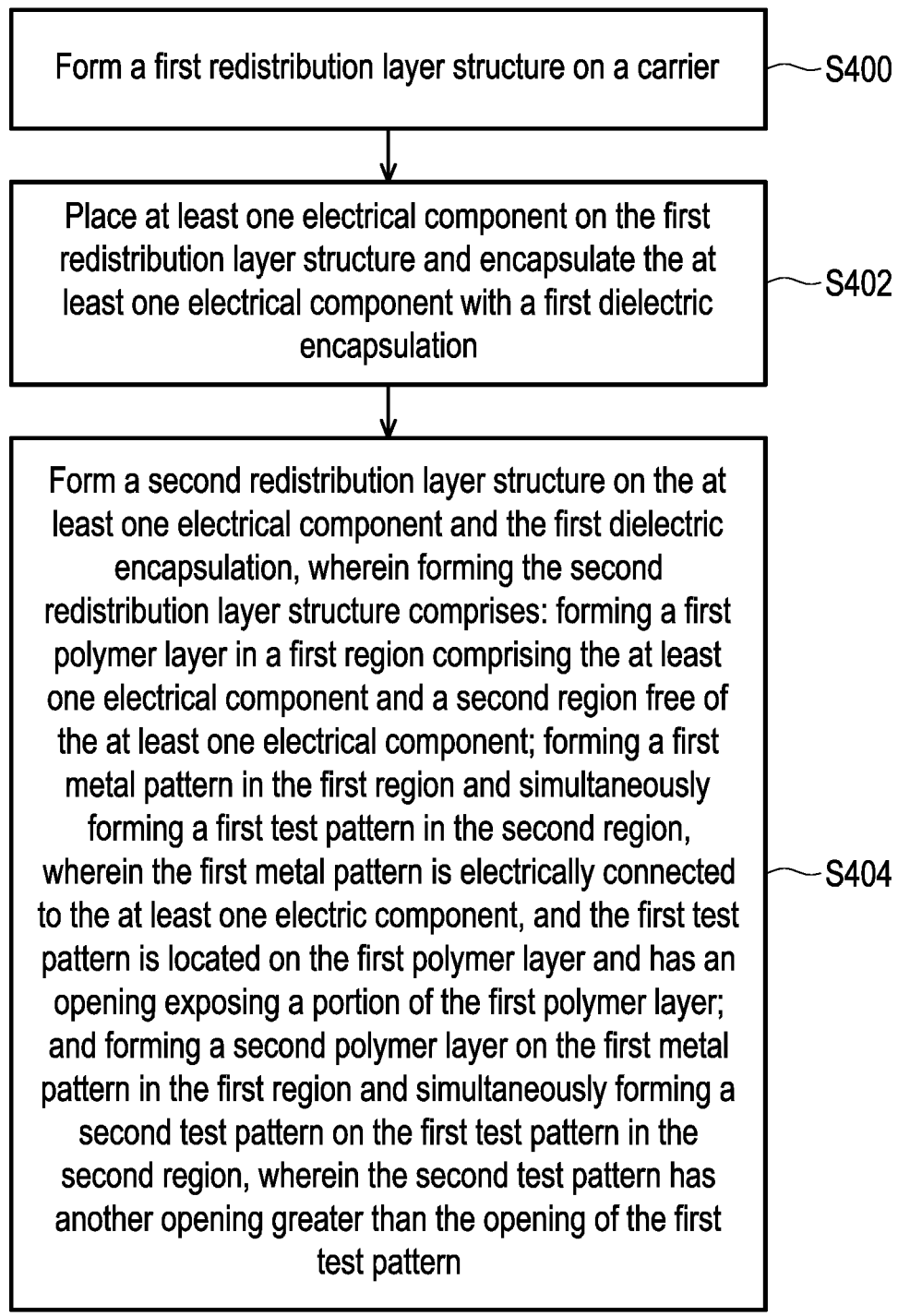
FIG. 6 illustrates a flow chart of a method of forming a semiconductor structure in accordance with some embodiments.

FIG. 6 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S400, a first redistribution layer structure is formed on a carrier. FIG. 1 and FIG. 2 illustrate different views corresponding to some embodiments of act S400.

At act S402, at least one electrical component is placed on the first redistribution layer structure and the at least one electrical component is encapsulated with a first dielectric encapsulation. FIG. 1, FIG. 2 and FIG. 4A illustrate different views corresponding to some embodiments of act S402. In some embodiments, through dielectric vias are further formed aside the at least one electrical component, wherein the through dielectric vias are encapsulated by the first dielectric encapsulation.

At act S404, a second redistribution layer structure is formed on the at least one electrical component and the first dielectric encapsulation, wherein forming the second redistribution layer structure includes: forming a first polymer layer in a first region comprising the at least one electrical component and a second region free of the at least one electrical component; forming a first metal pattern in the first region and simultaneously forming a first test pattern in the second region, wherein the first metal pattern is electrically connected to the at least one electric component, and the first test pattern is located on the first polymer layer and has an opening exposing a portion of the first polymer layer; and forming a second polymer layer on the first metal pattern in the first region and simultaneously forming a second test pattern on the first test pattern in the second region, wherein the second test pattern has another opening greater than the opening of the first test pattern. FIG. 4A to FIG. 4B illustrate different views corresponding to some embodiments of act S404. In some embodiments, the first metal pattern has an upper portion located on the first polymer layer and a lower portion penetrating through the first polymer layer and electrically connected to the at least one electrical component. In some embodiments, a critical dimension of the first redistribution layer structure is less than a critical dimension of the second redistribution layer structure. In some embodiments, the first test pattern and the second test pattern constitute an overlay mark. In some embodiments, the first metal pattern and the first test pattern are defined by the same photomask. In some embodiments, the second polymer layer and the second test pattern are defined by the same photomask.

In some embodiments, forming the second redistribution layer structure further includes: forming a second metal pattern in the first region and simultaneously forming a third test pattern in a third region, wherein the second metal pattern is electrically connected to the first metal pattern, and the third test pattern is located on the second polymer layer and has an opening exposing a portion of the second polymer layer; and forming a third polymer layer on the second metal pattern in the first region and simultaneously forming a fourth test pattern on the third test pattern in the third region, wherein the fourth test pattern has another opening greater than the opening of the third test pattern. In some embodiments, the second metal pattern and the third test pattern are defined by the same photomask. In some embodiments, the third polymer layer and the fourth test pattern are defined by the same photomask.

In view of the above, the present disclosure provides a novel test key with better recognition for inline overlay inspection, so as to improve overlay control and the device performance. The novel test key of the disclosure can be applied to a redistribution layer structure of any semiconductor package. Specifically, when the polymer/metal thickness of a redistribution layer structure is too thick to be accurately measured for optical overlay check, the novel test key of the disclosure can be applied to resolve the issue.

In accordance with some embodiments of the present disclosure, a method of forming a semiconductor structure is provided. A carrier is provided with a package region and a test region. A first polymer layer is formed in the package region and the test region. A first metal pattern is formed in the package region and a first test pattern is simultaneously formed in the test region, wherein the first metal pattern has an upper portion located on the first polymer layer and a lower portion penetrating through the first polymer layer and electrically connected to an underlying electrical component, and the first test pattern is located on the first polymer layer and has a first opening exposing a portion of the first polymer layer. A second polymer layer is formed on the first metal pattern in the package region and a second test pattern is simultaneously formed on the first test pattern in the test region, wherein the second polymer layer has a second opening exposing a portion of the upper portion of the first metal pattern, and the second test pattern has a third opening greater than the first opening of the first test pattern.

In accordance with alternative embodiments of the present disclosure, a method of forming a semiconductor structure is provided. A first redistribution layer structure is formed on a carrier. At least one electrical component is placed on the first redistribution layer structure and encapsulating the at least one electrical component with a first dielectric encapsulation. A second redistribution layer structure is formed on the at least one electrical component and the first dielectric encapsulation. The operation of forming the second redistribution layer structure includes: forming a first polymer layer in a first region comprising the at least one electrical component and a second region free of the at least one electrical component; forming a first metal pattern in the first region and simultaneously forming a first test pattern in the second region, wherein the first metal pattern is electrically connected to the at least one electrical component, and the first test pattern is located on the first polymer layer and has an opening exposing a portion of the first polymer layer; and forming a second polymer layer on the first metal pattern in the first region and simultaneously forming a second test pattern on the first test pattern in the second region, wherein the second test pattern has another opening greater than the opening of the first test pattern.

In accordance with yet alternative embodiments of the present disclosure, a semiconductor structure includes a first polymer layer disposed across a package region and a test region, a first metal pattern is disposed in the package region and has an upper portion located on the first polymer layer and a lower portion penetrating through the first polymer layer and electrically connected to an underlying electrical component, a first test pattern disposed in the test region, wherein the first test pattern is located on the first polymer layer and has a first opening exposing a portion of the first polymer layer, a second polymer layer disposed on the first metal pattern in the package region, wherein the second polymer layer has a second opening exposing a portion of the upper portion of the first metal pattern, and a second test pattern disposed on the first test pattern in the test region, wherein the second test pattern has a third opening greater than the first opening of the first test pattern.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
providing a carrier comprising a package region and a test region;
forming a first polymer layer in the package region and the test region;
forming a first metal pattern in the package region and simultaneously forming a first test pattern in the test region, wherein the first metal pattern has an upper portion located on the first polymer layer and a lower portion penetrating through the first polymer layer and electrically connected to an underlying electrical component, and the first test pattern is located on the first polymer layer and has a first opening exposing a portion of the first polymer layer; and
forming a second polymer layer on the first metal pattern in the package region and forming a second test pattern on the first test pattern in the test region, wherein the second test pattern is a polymer pattern, and wherein the second polymer layer has a second opening exposing a portion of the upper portion of the first metal pattern, and the second test pattern has a third opening greater than the first opening of the first test pattern.

2. The method of claim 1, wherein the test region is in a periphery region of the package region.

3. The method of claim 1, wherein the carrier comprises a plurality of package regions separated by a plurality of scribe regions, and the test region is in the scribe regions.

4. The method of claim 1, wherein the electrical component comprises an interposer, a through via, a semiconductor die or a combination thereof.

5. The method of claim 1, wherein the first test pattern and the second test pattern constitute an overlay mark.

6. The method of claim 1, wherein the third opening of the second test pattern exposes a portion of the first test pattern and the first polymer layer.

7. The method of claim 1, wherein the first metal pattern and the first test pattern are formed by an electroplating process.

8. A method of forming a semiconductor structure, comprising:
forming a first redistribution layer structure on a carrier;
placing at least one electrical component on the first redistribution layer structure and encapsulating the at least one electrical component with a first dielectric encapsulation; and
forming a second redistribution layer structure on the at least one electrical component and the first dielectric encapsulation,
wherein forming the second redistribution layer structure comprises:
forming a first polymer layer in a first region comprising the at least one electrical component and a second region free of the at least one electrical component;
forming a first metal pattern in the first region and simultaneously forming a first test pattern in the second region, wherein the first metal pattern is electrically connected to the at least one electrical component, and the first test pattern is located on the first polymer layer and has an opening exposing a portion of the first polymer layer; and
forming a second polymer layer on the first metal pattern in the first region and simultaneously forming a second test pattern on the first test pattern in the second region, wherein the second test pattern has another opening greater than the opening of the first test pattern.

9. The method of claim 8, further comprising forming through dielectric vias aside the at least one electrical component, wherein the through dielectric vias are encapsulated by the first dielectric encapsulation.

10. The method of claim 8, wherein the first metal pattern has an upper portion located on the first polymer layer and a lower portion penetrating through the first polymer layer and electrically connected to the at least one electrical component.

11. The method of claim 8, wherein a critical dimension of the first redistribution layer structure is less than a critical dimension of the second redistribution layer structure.

12. The method of claim 8, wherein the first test pattern and the second test pattern constitute an overlay mark.

13. The method of claim 8, wherein the first metal pattern and the first test pattern are defined by a first photomask.

14. The method of claim 8, wherein forming the second redistribution layer structure further comprises:
forming a second metal pattern in the first region and simultaneously forming a third test pattern in a third region, wherein the second metal pattern is electrically connected to the first metal pattern, and the third test pattern is located on the second polymer layer and has an opening exposing a portion of the second polymer layer; and
forming a third polymer layer on the second metal pattern in the first region and simultaneously forming a fourth test pattern on the third test pattern in the third region, wherein the fourth test pattern has another opening greater than the opening of the third test pattern.

15. A method of forming a semiconductor structure, comprising:
providing a carrier comprising a package region and a test region;
forming a first polymer layer in the package region and the test region;
forming a first metal pattern in the package region and simultaneously forming a first test pattern in the test region, wherein a first cross-sectional shape of the first metal pattern is different from a second cross-sectional shape of first test pattern; and
forming a second polymer layer on the first metal pattern in the package region and forming a second test pattern on the first test pattern in the test region, wherein the second test pattern is a polymer pattern, and wherein the second test pattern exposes a portion of the first test pattern, and the exposed portion has a donut shape from a top view.

16. The method of claim 15, wherein the first metal pattern has an upper portion located on the first polymer layer and a lower portion penetrating through the first polymer layer and electrically connected to an underlying electrical component, and the first test pattern is located on the first polymer layer and has a first opening exposing a portion of the first polymer layer.

17. The method of claim 16, wherein the second polymer layer has a second opening exposing a portion of the upper portion of the first metal pattern, and the second test pattern has a third opening greater than the first opening of the first test pattern.

18. The method of claim 15, wherein the test region is in a periphery region of the package region.

19. The method of claim 15, wherein the carrier comprises a plurality of package regions separated by a plurality of scribe regions, and the test region is in the scribe regions.

20. The method of claim 15, wherein the test region is in a seal ring region.

\* \* \* \* \*